United States Patent
Yao

(10) Patent No.: US 7,149,598 B1
(45) Date of Patent: Dec. 12, 2006

(54) PROCESS-ORIENTED MODULIZED PLANT FOR TFT-LCD FABRICATION

(75) Inventor: Kenneth Yao, Taipei (TW)

(73) Assignee: L&K Engineering Co., Ltd., Taipei (TW)

( * ) Notice: Subject to any disclaimer, the term of this patent is extended or adjusted under 35 U.S.C. 154(b) by 0 days.

(21) Appl. No.: 11/390,163

(22) Filed: Mar. 28, 2006

(51) Int. Cl.
*G06F 19/00* (2006.01)

(52) U.S. Cl. ............. 700/121; 700/182; 700/108; 134/1.3; 438/782; 118/715

(58) Field of Classification Search ......... 700/96, 700/121, 108, 110, 182; 438/30, 155, 328, 438/705; 257/75, 66; 134/1–3, 146; 118/715; 414/331.01
See application file for complete search history.

(56) References Cited

U.S. PATENT DOCUMENTS

| | | | |
|---|---|---|---|
| 6,776,171 B1 * | 8/2004 | Carpenter et al. | 134/1.3 |
| 2002/0170586 A1 * | 11/2002 | Lee et al. | 134/146 |
| 2006/0081181 A1 * | 4/2006 | Miyazaki et al. | 118/715 |
| 2006/0182556 A1 * | 8/2006 | Liu et al. | 414/331.01 |

* cited by examiner

*Primary Examiner*—Kidest Bahta
(74) *Attorney, Agent, or Firm*—Rosenberg, Klein & Lee

(57) ABSTRACT

A process-oriented modulized plant for TFT-LCD fabrication capable of preventing cross contaminations is proposed. A plant includes a plurality of independent fabs and warehouses connected between the fabs. Each independent fab can carry out at least one TFT-LCD processes. The respective process used in the first independent fab produces the first group of contaminants. Another respective processes carried out in the second independent fab are affected by the contaminations from the first group of contaminants and results in deterioration of yield rate of the fabrication. At least one automatic transport-and-storage system for central collection and distribution is located in each warehouse. Each warehouse is connected to the independent fabs via at least one automated material handling system to link up the processes together. Moreover, the processes carried out in these independent fabs differ from the others, generate different contamination sources, and/or are sensitive to the corresponding sources form the others.

9 Claims, 1 Drawing Sheet

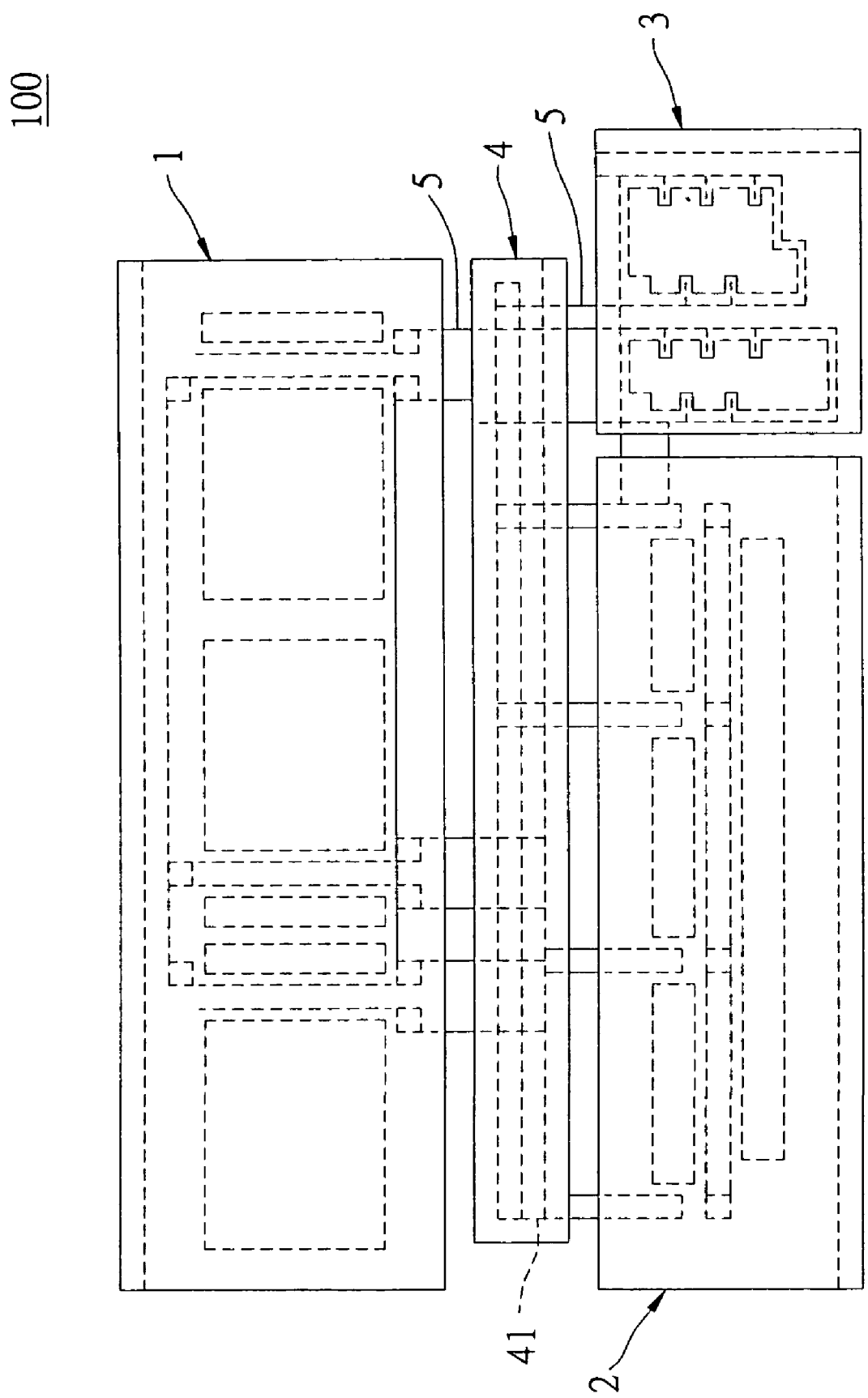

PROCESS-ORIENTED MODULIZED PLANT FOR TFT-LCD FABRICATION

BACKGROUND OF THE INVENTION

1. Field of the Invention

The present invention relates to a process-oriented modulized plant for TFT-LCD fabrication and that is capable of modulizing fabs corresponding to the characteristics of the manufacturing processes. The modulized plant is provided to avoid cross contaminations between the processes.

2. Description of Related Art

As the TFT-LCD technology progresses, particulates are no longer the main factor that causes defects of microelectronic devices and circuits. The cross contaminations existing between different processes have gradually become another important factor that causes the defects. For example, the thin film process is subject to the contamination of organic or acid gases, which affect the yield, yet the photolithography process produces these organic gases. Moreover, the photolithography process is influenced by temperature, humidity, and microvibrations that may lower the yield, but the thin film process is exactly a high heat-releasing process. Therefore, if the thin film process and the photolithography process are arranged in the same space, the temperature interferences and the cross contaminations will arise.

Several processes in a TFT-LCD factory are exemplified below. The thin film process is a high heat-releasing process with low cleanliness requirement (FED Std 209E Class 10,000). Its purity, level of airborne molecular contamination, is subject to contaminations of organic or acidic gases. The photolithography process is influenced by microvibrations, temperature and humidity. The requirement of temperature/humidity, 23±1 (or 2)° C./55%±1 (or 2)% should be met by the photolithography process. Its cleanliness requirement (FED Std 209E Class 100 or Class 10) is higherthan that of the thin film process, but the photolithography process is a source of organic gases. The etching process is hardly affected by temperature and humidity. Its cleanliness requirement (FED Std 209E Class 10,000 or 100,000) is lower than that of the photolithography process. However, the etching process is a source of acidic and alkaline gases. The stripping process is also hardly affected by temperature and humidity, and its cleanliness (FED Std 209E Class 10,000 or 100,000) is lower than that of the photolithography process. The stripping process is a source of stripper, which contains organic gases.

To summarize the above statements, if different processes are placed together without appropriate separation or arrangement, the cross contaminations between different processes will inevitably arise and the yield will deteriorate greatly.

A conventional common optoelectronic factory is basically divided into four process areas: array, color filter, cell, and module. All processes of each process area are located in the same building. The more advance the generation of the TFT-LCD technology is, the larger the substrate is. Thus, following problems resulted from the large substrate will arise:

1. More serious cross contaminations between the different processes for larger substrates occurr, while the different processes are located in the same process area. Even separations are carefully established in the site, contaminants in the air will spread via an automated material handling system.

2. Facilities would be damaged quickly by fire accidents or smoke pollutions. All processes of TFT-LCD fabrication are arranged in their respective floors in the same building, and the equipment of these processes may be damaged at the same time by fire accidents or smoke pollutions. Moreover, the insurance fee would increase for this reason.

3. The whole-plant expenses and construction cost increase significantly, because the substrate is large and it is necessary to enlarge the fab area for each process. The quantity of work to establish the factory increases, and the construction schedule is prolonged. In consideration of the investment and market timing, shortening construction schedule will bring about poor quality or industrial safety accidents of the project.

4. Buildings with excessive height waste money. All existent advanced-generation TFT-LCD factories utilize an automated material handling system to link up all of the processes arranged in respective floors of the same building. In order to store large quantity of substrates per unit area, an automatic transport-and-stock system should be built as the tallest equipment through the whole building. If the automatic transport-and-stock system is arranged with the process tools in the same building, the height of building accommodating the automatic transport-and-storage system may be unnecessary and can be lowered in some areas.

5. The initial and operation costs of HVAC (Heating, Ventilation and Air Condition) system must meet the highest cleanliness class required by particular processes, such as the photolithography process, because all of the processes are arranged in the same building. The HVAC system, which is over-designed but not corresponding to the practical cleanliness of various processes, results in wastingmoney.

6. Very high level of microvibration control for the whole building increases construction cost. Usually, processes with high requirements for microvibration control are only limited to specific areas, and the most stringent microvibration criterion is applied to the whole building. Such design concept is only appropriate for the past small-sized substrates. However, for new generation of TFT LCD, the building is larger than before so the past microvibration design concept for building is not suitable and makes unnecessary in crease in construction cost.

7. Risks of extension of construction schedule and increases of safety problems will occur. For new generation of TFT LCD, large-sized substrates need large-sized tools. Some problems come about: one is the large-sized tools are difficult to move in and should be assembled at the site. Therefore, the large-sized tools should move in after the clean room has been built up. Besides, the construction schedule of the large-sized factory is longer than that of the small-sized factory. After the completion of the large-sized tools in the large-sized factory, the market timing may be missed. Another one is the existing building has only a few number of move-in ports in the same floor for transporting large-sized tools. Hence, the move-in schedule will be prolonged and the industrial safety problems may arise.

Accordingly, the present invention aims to design a plant to solve the above problems in the prior art.

SUMMARY OF THE INVENTION

An object of the present invention is to provide a process-oriented modulized plant for TFT-LCD fabrication, which includes a plurality of individual fabs. The individual fabs independent to others are capable of preventing the cross contaminations. In addition, the processes are based on environmental requirements as to be carried out in different fabs. At least one process locates in each fab, which can be treated as one module. Thus, the cross contaminations between processes of variable environmental requirements can be prevented, the whole-plant expenses can be reduced and the damages by fire accident or smoke pollution can be avoided. If a fire accident were to happen, the plant according to the present invention would be recovered within short reconstruction time and low reconstruction expenses. Furthermore, the construction costs can be saved by setting up the fabs at properly classified levels of microvibration control. In addition, the construction schedule and safety problems of plants with preset invention are well under control.

Another object of the present invention is to provide a process-oriented modulized plant for TFT-LCD fabrication, including automatic transport-and-storage systems for central collection and distribution, setting up in respective warehouses. The warehouses are located between these fabs so that the height of fabs can be reduced.

Yet another object of the present invention is to provide a process-oriented modulized plant for TFT-LCD fabrication, which includes a plurality of fabs carrying out their respective processes to meet various cleanliness requirements. The processes arranged in different individual fabs can be equipped with respective HVAC systems that meet practical cleanliness classes.

To achieve the above objects, the present invention provides a process-oriented modulized plant for TFT-LCD fabrication, which comprises a first independent fab, a second independent fab, and a plurality of warehouses arranged between the first and second independent fabs. The first independent fab carries out at least one process that produces a first group of contaminants in common. The second independent fab carries out at least another process, which is affected by the contamination from the first group of contaminants, results in deterioration of yield rate of the fabrication. Each of the warehouses has at least one automatic transport-and-storage system that is used for central collection and distribution. The warehouses located between and connecting the independent fabs via an automated material handling system so the processes are linked up. The process is utilized in the first independent fab differs from that in the second independent fab, generates contamination sources different from those made in the second independent fab, and/or is sensitive to the corresponding sources from the other fabs. Therefore, the cross contaminations between the processes are prevent with this invention.

BRIEF DESCRIPTION OF THE DRAWING

The objects and advantages of the present invention will be readily understood from the following detailed description in conjunction with the appended drawing, in which:

The FIGURE is a top view of a process-oriented modulized plant for TFT-LCD fabrication according to the present invention.

DETAILED DESCRIPTION OF THE PREFERRED EMBODIMENTS

According to the present invention, a process-oriented modulized plant for TFT-LCD fabrication is provided in the FIGURE.

A plant 100 for manufacturing TFT LCD includes a thin film process, a photolithography process, an etching process and a stripping process.

The thin film process is a high heat-releasing process with a low cleanliness requirement (FED Std 209E Class 10,000), and is affected by contaminations of organic or acidic gases. In other words, the thin film process is sensitive to the corresponding contaminants from the other fabs that can generate organic or acidic gases.

The photolithography process is influenced by microvibrations, temperature and humidity (i.e., sensitive to microvibrations, temperature and humidity). The photolithography process has a high cleanliness requirement (FED Std 209E Class 100 or Class 10), and is a source of organic gases. In other words, the photolithography process is an organic-gas contamination source.

The etching process is hardly affected by temperature and humidity, and has a low cleanliness requirement (FED Std 209E Class 10,000 or Class 100,000). The etching process creates a source of acidic and alkaline gases. In other words, the etching process is also a contamination source.

The stripping process is hardly affected by temperature and humidity, and has a low cleanliness requirement (FED Std 209E Class 10,000 or Class 100,000). The stripping process is a source releasing the stripper. That is to say the stripping process is also a contamination source, which contains organic gases.

In order to prevent cross contaminations, processes affected by particular contaminants should be kept away from the other processes that generate those contaminants. This consideration is the first criterion. Moreover, processes demanding a high-quality HVAC system should be kept away from another processes requiring only an ordinary HVAC system. This consideration is the second criterion. Besides, the processes need to be based on environmental requirements and carried out in different fabs. This consideration is the third criterion.

The plant 100 according to the present invention includes a plurality of independent fabs based on the above three criteria. A warehouse 4 is also connected between these independent fabs. At least one automatic transport-and-storage system 41, for central collection and distribution, is disposed in the warehouse 4. The warehouse 4 is connected between the independent fabs via an automated material handling system 5 to link up the processes in different fabs.

A first independent fab 1 carries out at least one process, such as the photolithography process, the etching process, the stripping process or combination thereof. The process (or processes) in the first independent fab can be treated as a first module. The process carried out in the first independent fab 1 can generate the first group of contaminants (e.g., organic, acidic, or alkaline gases).

A second independent fab 2 carries out at least one process (e.g., thin film process), and can be treated as a second module. The process carried out in the second independent fab 2 obviously differs from that in the first independent fab 1. The process carried out in the second independent fab 2 may be contaminated by the first group of contaminants and results in deterioration of yield rate of the fabrication.

It is not suitable to arrange all of the processes together because of different requirements of HVAC system. For example, the etching process or the stripping process, adapts to an ordinary HVAC system, can be utilized in a third independent fab 3 and treated as a third module. On the contrary, the first module, such as the photolithography process, in the first independent fab requires a high-quality HVAC system. In this way, HVAC systems meeting different cleanliness classes are selected provided for different independent fabs, and the waste of initial and operational costs can be prevented.

In addition to carrying out the thin film process, the second independent fab 2 also carries out the cleaning process and the dry etching process, that won't cause cross contaminations. The third independent fab 3 carries out the wet etching process and the stripping process. The processes carried out in the above independent fabs differ from the others, and generate different contamination sources and/or sensitive to the corresponding sources from the other fabs.

Therefore, based on the above three criteria, the respective processes under similar conditions in any one of independent fabs can be carried out in the same environment to prevent the cross contaminations, and this is beneficial to implementing the array process of TFT-LCD in the present embodiment.

Referring to the FIGURE, the individual warehouses 4 are connected between these independent fabs via a plurality of automated material handling system 5. The automatic transport-and-storage system 41 in the warehouse 4 plays a role of central collection and distribution to link up the processes. The automatic transport-and-storage system 41 includes a plurality of stock racks and a plurality of transport vehicles (not shown).

Based on the above reason, cross contaminations may occur between the cell and the color filter processes. Therefore, the idea described about independent fabs separated according to their process characteristics and connected between one and another via individual warehouses can be applied to the cell and the color filter processes.

If another expanded independent fabs, except the first, second and third independent fabs, are provided, a plurality of expanded warehouses connect between the expanded independent fabs via the automated material handling system. Furthermore, the expanded warehouses connect among respective ones of the expanded independent fabs via the automated material handling system. Thus, the expanded processes and the processes in the first and second fabs are linked up together.

To sum up, process-oriented modulized plant for TFT-LCD fabrication described in the present invention has the following characteristics and advantages:

1. Cross contaminations can be prevented. The plant 100 includes a plurality of independent fabs (e.g., 1, 2, 3). Each independent fab is under specific conditions by similar environmental requirements in order to prevent cross contaminations.
2. Damages from fire accident or smoke pollution can be minimized. Independent fabs in the plant 100 are separated, the fire accident or the smoke pollution will not cause overall damages at once. Consequently, the operation of the plant still runs in a regular manner after accidents.
3. The whole-plant expenses and construction cost can be decreased. The height of each building can be lowered because the processes are carried out in plural independent fabs, so that whole-plant expenses and construction cost can be lowered while keeping the construction on schedule.
4. Excessive building height of the fabs can be prevented. The conventional manner for all the processes arranged in the same one building in prior art makes the excessive height is converted to the present manner for the processes carried out in pluralities of independent fabs respectively makes the height of each building suitably. The independent fabs connect with each other via the individual automatic transport-and-storage system. Because each independent fab only contains some processes needing similar environmental conditions and being designed with the appropriate height, only the automatic transport-and-storage system 41 of the warehouse 4 would be taller, if needed, than the fabs. Thus, the construction costs due to the excessive height of buildings can be saved.
5. The initial and operational costs of a unified HVAC system meeting high level can be reduced. Because cleanliness requirement of the processes maybe different, each of the fabs can provide a specific HVAC system meeting its respective cleanliness class.
6. Construction costs can be lowered by proper classification of microvibrations. Depending on the individual fabs, processes with different microvibration requirements are effectively classified in the corresponding building to lower the construction costs.
7. Construction schedule and safety are under control. The complexity of construction can be reduced because the single high building converts into few fabs. The construction schedule is shorter than that of the single building. Moreover, these independent fabs have more move-in ports for transporting process tools, so the industrial safety can be under better control. The move-in can speed up. Besides, the ramp-up time for each process tool could be shortened.

Although the present invention has been described with reference to the preferred embodiment thereof, it should be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed is:

1. A process-oriented modulized plant for TFT-LCD fabrication comprising:
 a first independent fab, which includes at least one process, wherein the process carried out in the first independent fab produces a first group of contaminants;
 a second independent fab, which includes at least one additional process affected by the contaminations from the first group of contaminants that results in deterioration of yield rate of the fabrication; wherein the process utilized in the first independent fab differs from that in the second independent fab, generates contamination sources different from those made in the second independent fab, and/or is sensitive to the corresponding sources generated by the processes in the other fabs; therefore, the cross contaminations between the processes in the first and second fabs are prevented; and
 a plurality of warehouses located between and connecting the first and second independent fabs, wherein each of the warehouses has at least one automatic transport-and-storage system that is used for central collection and distribution, and at least one automated material handling system communicating with the above fabs so the processes are linked up.

2. The process-oriented modulized plant for TFT-LCD fabrication as claimed in claim 1, further including a third independent fab, which includes at least one further process differing from the prior ones utilized in the first and second independent fabs; wherein the third independent fab includes an ordinary HVAC system or a high-quality HVAC system meeting high-level cleanliness classes for meeting specific environmental requirements of the further process, while the first independent fab includes a HVAC system, which is contrary to that in the third fab exactly.

3. The process-oriented modulized plant for TFT-LCD fabrication as claimed in claim 2, wherein the third independent fab is connected to the warehouses via the automated material handling system.

4. The process-oriented modulized plant for TFT-LCD fabrication as claimed in claim 1, further including:
- a plurality of expanded independent fabs that have respective expanded processes differing from the other;
- wherein each of the expanded processes differs from the above processes utilized in the first and second independent fabs;
- wherein the expanded processes are classified according to criteria for classifying the first and second independent fabs, and the expanded processes utilized in the expanded independent fabs generate different contamination sources and/or are sensitive to the corresponding sources from the other fabs.

5. The process-oriented modulized plant for TFT-LCD fabrication as claimed in claim 4, wherein the expanded independent fabs are connected to the warehouses via the respective automated material handling system, so the expanded processes and the processes in the first and second fabs are linked up together.

6. The process-oriented modulized plant for TFT-LCD fabrication as claimed in claim 4, further including a plurality of expanded warehouses connected among respective ones of the expanded independent fabs via an expanded automated material handling system, so that the expanded independent fabs are linked up together.

7. The process-oriented modulized plant for TFT-LCD fabrication as claimed in claim 1, wherein the processes are based on environmental requirements to be classified into different fabs.

8. The process-oriented modulized plant for TFT-LCD fabrication as claimed in claim 1, wherein the automatic transport-and-storage system includes a plurality of stock racks and a quantity of transport vehicles.

9. The process-oriented modulized plant for TFT-LCD fabrication as claimed in claim 1, wherein each of the warehouses is an individual building.

* * * * *